(12) United States Patent
Yoo et al.

(10) Patent No.: US 11,545,372 B2
(45) Date of Patent: *Jan. 3, 2023

(54) PLASMA GENERATOR, CLEANING LIQUID PROCESSING APPARATUS, SEMICONDUCTOR DEVICE CLEANING APPARATUS, CLEANING LIQUID PROCESSING METHOD, AND METHOD OF MANUFACTURING SEMICONDUCTOR DEVICE

(71) Applicant: Samsung Electronics Co., Ltd., Suwon-si (KR)

(72) Inventors: Beom Jin Yoo, Hwaseong-si (KR); Min Hyoung Kim, Seoul (KR); Sang Ki Nam, Seongnam-si (KR); Lu Siqing, Seongnam-si (KR); Won Hyuk Jang, Seoul (KR); Kyu Hee Han, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 352 days.

This patent is subject to a terminal disclaimer.

(21) Appl. No.: 16/421,473

(22) Filed: May 24, 2019

(65) Prior Publication Data
US 2020/0020551 A1 Jan. 16, 2020

(30) Foreign Application Priority Data
Jul. 13, 2018 (KR) .................. 10-2018-0081442

(51) Int. Cl.
*H01L 21/67* (2006.01)
*H01L 21/687* (2006.01)
*B08B 3/10* (2006.01)

(52) U.S. Cl.
CPC .......... *H01L 21/67051* (2013.01); *B08B 3/10* (2013.01); *H01L 21/68764* (2013.01)

(58) Field of Classification Search
None
See application file for complete search history.

(56) References Cited

U.S. PATENT DOCUMENTS 6,006,763 A * 12/1999 Mori .................. B08B 3/10
134/1.1
8,361,548 B2   1/2013 Moffat et al.
(Continued)

FOREIGN PATENT DOCUMENTS

CN    104797533 A    7/2015
JP    H07283184 A    10/1995
(Continued)

OTHER PUBLICATIONS

First Office Action dated Apr. 18, 2022 issued by the Korean Intellectual Property Office for corresponding application KR 10-2018-0081442.

*Primary Examiner* — Ram N Kackar
(74) *Attorney, Agent, or Firm* — Muir Patent Law, PLLC

(57) ABSTRACT

A plasma generator, a cleaning liquid processing apparatus including the same, a semiconductor cleaning apparatus, and a cleaning liquid processing method are provided. The cleaning liquid processing apparatus comprising a bubble formation section configured to lower a pressure of a mixed liquid obtained by mixing a liquid and a gas to form bubbles in the mixed liquid, a plasma generator connected to the bubble formation section and configured to apply a voltage to the mixed liquid to form plasma in the bubbles formed in the mixed liquid, a mixing section connected to the plasma generator and configured to dissolve radicals included in the plasma into the mixed liquid, and a discharge nozzle connected to the mixing section and configured to discharge the mixed liquid to a wafer.

17 Claims, 18 Drawing Sheets

(56) References Cited

U.S. PATENT DOCUMENTS

| | | | |
|---|---|---|---|
| 9,540,256 B2 | 1/2017 | Fujikane et al. | |
| 11,107,705 B2* | 8/2021 | Yoo | H01L 21/02057 |
| 2002/0157686 A1* | 10/2002 | Kenny | H05K 3/3426 |
| | | | 134/1.3 |
| 2006/0060464 A1* | 3/2006 | Chang | H05H 1/46 |
| | | | 422/186 |
| 2014/0138029 A1* | 5/2014 | Narita | C02F 1/78 |
| | | | 156/345.27 |
| 2015/0162224 A1* | 6/2015 | Hinode | H01L 21/67115 |
| | | | 438/751 |
| 2015/0191371 A1* | 7/2015 | Fujikane | C02F 1/4608 |
| | | | 210/748.17 |
| 2015/0251933 A1* | 9/2015 | Nakamura | C02F 1/4608 |
| | | | 210/748.17 |
| 2017/0328642 A1* | 11/2017 | Wang | F28F 9/0275 |
| 2017/0354024 A1* | 12/2017 | Lu | C01B 21/30 |
| 2018/0158700 A1* | 6/2018 | Shomori | H01L 21/67253 |

FOREIGN PATENT DOCUMENTS

| | | |
|---|---|---|
| JP | 2014079743 A | 5/2014 |
| JP | 5889433 B2 | 3/2016 |
| KR | 10-2003-0007166 A | 1/2003 |
| KR | 1020060069526 A | 6/2006 |
| KR | 1020100060494 A | 6/2010 |
| KR | 10-0980281 B1 | 9/2010 |
| KR | 10-0987977 B1 | 10/2010 |
| KR | 10-1647586 B1 | 8/2016 |

* cited by examiner

PLASMA GENERATOR, CLEANING LIQUID PROCESSING APPARATUS, SEMICONDUCTOR DEVICE CLEANING APPARATUS, CLEANING LIQUID PROCESSING METHOD, AND METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2018-0081442 filed on Jul. 13, 2018 in the Korean Intellectual Property Office, the contents of which in its entirety are hereby incorporated by reference.

BACKGROUND

1. Field of the Invention

The disclosure relates to a plasma generator, a cleaning liquid processing apparatus including the same, a semiconductor device cleaning apparatus, a cleaning liquid processing method, and a method of manufacturing a semiconductor device.

2. Description of the Related Art

A cleaning process is indispensable in a manufacturing process of a semiconductor device. Such a cleaning process is intended to remove residues, but it may unintentionally damage an active region such as a semiconductor pattern or a circuit pattern, e.g., a metal film pattern. This may be attributed to the fact that the cleaning liquid containing sulfuric acid or hydrofluoric acid causes corrosion or oxidation of the metal film. Further, such a cleaning liquid may cause environmental pollution.

Therefore, it is beneficial to develop new cleaning liquid capable of performing cleaning, while preventing and/or reducing such damage to semiconductor patterns and/or metal patterns. As the generation of semiconductor techniques continues to increase, since the number of semiconductor processes increases and the number of consequent cleaning processes also increases, development of environmentally friendly cleaning liquid which prevents and/or reduces damage to the semiconductor patterns and/or metal patterns will contribute to an advance of the industry.

SUMMARY

Aspects of the present invention provide a plasma generator which processes cleaning liquid preventing or reducing damage to exposed metal parts of a semiconductor element.

Aspects of the present invention also provide a cleaning liquid processing apparatus preventing or reducing damage to a semiconductor pattern.

Aspects of the present invention also provide a semiconductor cleaning apparatus preventing or reducing damage to the semiconductor pattern.

Aspects of the present invention also provide a cleaning liquid processing method for preventing or reducing damage to the semiconductor pattern.

The aspects of the present invention are not restricted to those mentioned above and other aspects which are not mentioned may be clearly understood by those skilled in the art from the description below.

According to an aspect of the present inventive concept, there is provided a cleaning liquid processing apparatus comprising a bubble formation section configured to lower a pressure of a mixed liquid obtained by mixing a liquid and a gas to form bubbles in the mixed liquid, a plasma generator connected to the bubble formation section and configured to apply a voltage to the mixed liquid to form plasma in the bubbles formed in the mixed liquid, a mixing section connected to the plasma generator and configured to dissolve radicals included in the plasma into the mixed liquid; and a discharge nozzle connected to the mixing section and configured to discharge the mixed liquid to a wafer.

According to an aspect of the present inventive concept, there is provided a semiconductor cleaning apparatus comprising a chamber, a chuck disposed inside the chamber, the chuck configured to receive a wafer, a cleaning liquid processing apparatus configured to inject a cleaning liquid onto an upper surface of the wafer, wherein the cleaning liquid processing apparatus includes a bubble formation section configured to lower pressure of a mixed liquid obtained by mixing a liquid and a gas to form bubbles in the mixed liquid, a plasma generator connected to the bubble formation section and configured to apply a voltage to the mixed liquid to form plasma in the bubbles formed in the bubble formation section, a mixing section connected to the plasma generator and configured to dissolve radicals included in the plasma into the mixed liquid to form the cleaning liquid, and a discharge nozzle connected to the mixing section and configured to discharge the cleaning liquid to the wafer.

According to an aspect of the present inventive concept, there is provided a plasma generator comprising an insulating housing which extends in a first direction, the plasma generator configured to mix a gas and a liquid to form a mixed liquid including bubbles formed of the gas in the insulating housing, the insulating housing configured to move the mixed liquid containing the bubbles in the first direction, and a plasma electrode located inside the insulating housing and configured to apply an RF pulse voltage to the mixed liquid, the plasma electrode including a first electrode and a second electrode, the first electrode connected to an RF pulse power supply, and the second electrode spaced apart from the first electrode and grounded, wherein the plasma electrode is configured to apply a voltage to the gas inside the bubbles to form plasma in the bubbles.

According to an aspect of the present inventive concept, there is provided a cleansing liquid processing method comprising mixing a liquid with a gas to form a mixed liquid, increasing pressure of the mixed liquid to supersaturate the gas in the mixed liquid, lowering the pressure of the mixed liquid to generate bubbles in the mixed liquid, applying an RF pulse voltage to the mixed liquid to form plasma in the bubbles, and dissolving radicals formed in the plasma into the mixed liquid.

BRIEF DESCRIPTION OF THE DRAWINGS

The above and other aspects and features of the present invention will become more apparent by describing exemplary embodiments in detail with reference to the attached drawings, in which.

DETAILED DESCRIPTION OF THE EMBODIMENTS

Hereinafter, a semiconductor cleaning apparatus according to some embodiments of the present invention will be described with reference to FIGS. 1 to 4.

Figure 1:
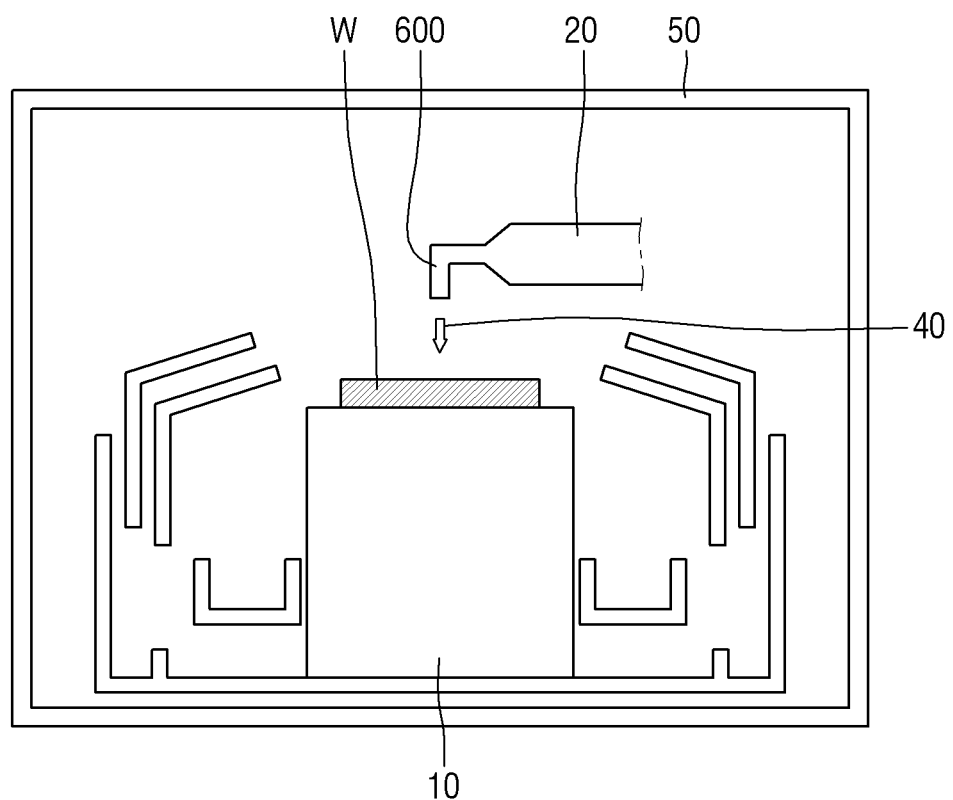
FIG. 1 is a conceptual diagram for explaining a semiconductor cleaning apparatus according to some embodiments of the present invention.

FIG. 1 is a conceptual diagram for explaining a semiconductor cleaning apparatus according to some embodiments of the present invention.

Referring to FIG. 1, the semiconductor cleaning apparatus according to some embodiments of the present invention may include a chamber 50, a chuck 10 and a first cleaning liquid processing apparatus 20.

A first direction X and a second direction Y may be horizontal directions intersecting each other. For example, the first direction X and the second direction Y may be orthogonal to each other. A third direction Z may be a direction intersecting the first direction X and the second direction Y. For example, the third direction Z may be orthogonal to both the first direction X and the second direction Y. Therefore, the first direction X, the second direction Y and the third direction Z may be all the orthogonal directions.

The chamber 50 may serve as a housing that includes other components inside. For example, the chamber 50 includes a cavity inside, and the chuck 10 and the first cleaning liquid processing apparatus 20 may be disposed in the cavity.

The chamber 50 may be an isolated space, isolated from outside of the chamber, and a wafer W may be cleaned in the chamber by a cleaning process performed in the chamber, a layer may be formed on the wafer W by a vapor deposition process, and a layer formed on the wafer W maybe etched and/or patterned by an etching process in the chamber. As the chamber 50 is isolated from the outside, process conditions of this process may be adjusted and/or controlled. For example, the process conditions such as temperature and/or pressure of the chamber may be adjusted/controlled differently from the outside.

The chuck 10 may be disposed in the chamber 50. The chuck 10 may support the wafer W disposed on the chuck 10. An upper surface of the chuck 10 may have a circular planar shape to support the wafer W having a circular shape in a plan view, but is not limited thereto. For example, the planar shape of the chuck 10 may be different from a circular shape, e.g., when the shape of the wafer W changes or for other reasons.

The chuck 10 may move in at least one direction of the first direction X, the second direction Y and the third direction Z. Accordingly, the chuck 10 may adjust the process position of the wafer W. For example, in order to adjust the plasma process position of the wafer W, the chuck 10 may move in one or more directions as described above.

The chuck 10 may rotate the wafer W, e.g., about the center of the wafer W in a plan view. The first cleaning liquid processing apparatus 20 may discharge a cleaning liquid 40 to the upper surface of the wafer W at a fixed position, e.g., at the center of the upper surface of the wafer W. As the wafer W rotates, the cleaning liquid 40 may uniformly spread over the entire upper surface of the wafer W.

In a semiconductor cleaning apparatus according to some embodiments of the present invention, the first cleaning liquid processing apparatus 20 may uniformly inject the cleaning liquid 40, while the first cleaning liquid processing apparatus 20 moves over the upper surface of the wafer W. At this time, the first cleaning liquid processing apparatus 20 may move in the first direction X and the second direction Y above the whole area of the wafer W. In such a case, a fine adjustment may be made so that the distribution of the cleaning liquid 40 on the wafer W becomes uniform.

Figure 2:
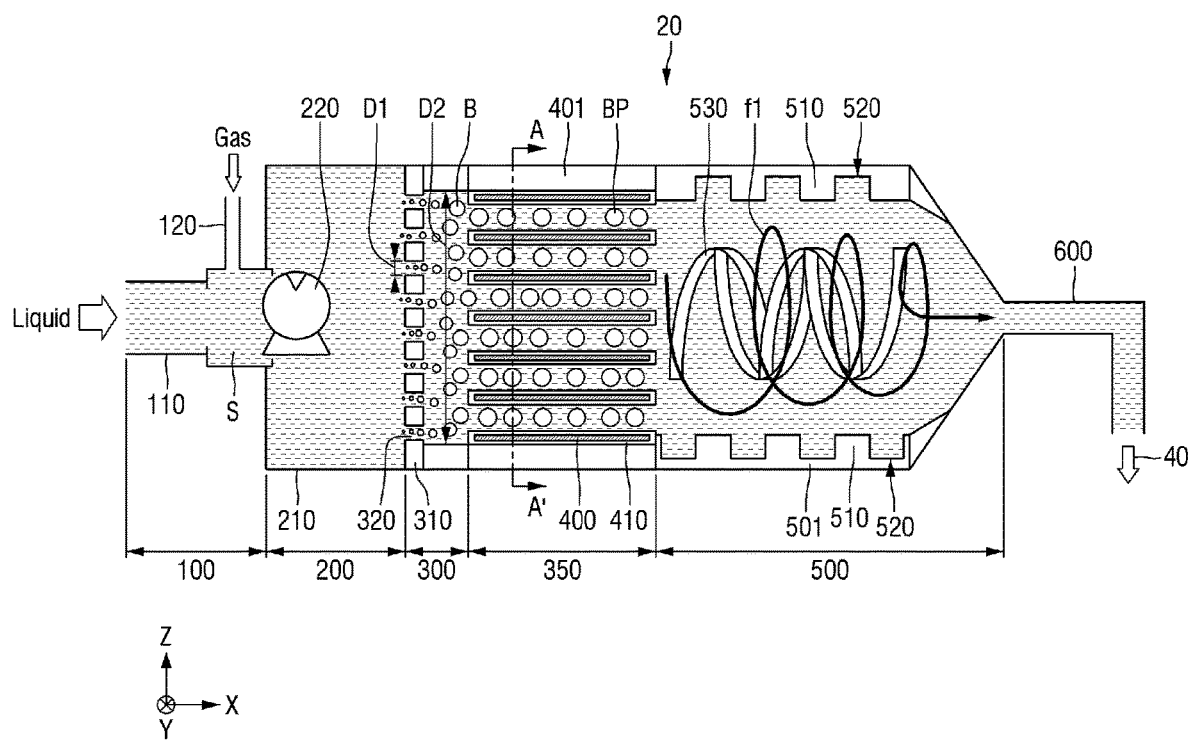
FIG. 2 is a block diagram for explaining a cleaning liquid processing apparatus of FIG. 1 in detail.

FIG. 2 is a block diagram for explaining the cleaning liquid processing apparatus of FIG. 1 in detail.

Referring to FIG. 2, the first cleaning liquid processing apparatus 20 according to some embodiments of the present invention may include a supply section 100, a blending section 200, a bubble formation section 300, a plasma generator 350, a mixing section 500, and a first discharge nozzle 600. The different "sections" described herein may be different chambers or compartments of the cleaning liquid processing apparatus being described, and may be separated by physical barriers or may be separate based on being formed of a particular structure, as will be apparent from review of the various figures and their corresponding descriptions.

The supply section 100 may include an inlet through which a liquid and a gas are supplied. The supply section 100 may include a solvent supply section 110 and a gas supply section 120.

A liquid which is a solvent included in the cleaning liquid 40 may be supplied to the solvent supply section 110. For example, the solvent may be at least one of a distilled liquid, a carbonated liquid (e.g., $CO_2$ water), an electrolyzed ionized liquid, and a cleaning liquid. However, the present invention is not limited to these examples.

A gas for generating radicals in the cleaning liquid 40 may be supplied to the gas supply section 120. Depending on the type of radicals used in the first cleaning liquid processing apparatus 20, the type of gases supplied to the gas inlet 120 may change. The type of supplied gases may include, for example, at least one of $O_2$, $H_2$, $N_2$, $NF_3$, $C_xF_y$, $F_2$, $Cl_2$, $Br_2$, He, Ar and mixed gas thereof.

For example, when oxygen ($O_2$) gas is supplied into the gas supply section 120, it is combined with liquid, and at least one radical of OH., O., $O_2$., $O_3$., $HO_2$., $H_3O$., and H. may be generated/included in the cleaning liquid 40. Alternatively, when using other gases, at least one radical of NO., $NO_2$., $NO_3$., $CO_2$., $CO_3$., Cl., F., Br., BrO., Cl., ClO. and $HF_2$. may also be generated/included in the cleaning liquid 40.

A radical is a material which is formed when a reaction occurs by a stimulus such as light, heat or electricity, and a material having a high reactivity and formed in the state of an atom or a compound having non-paired hole electrons. As a result, the radicals are not chemically stable and may transit to a stable state after a relatively short lifetime. Since these radicals have high reactivity, the radicals may cause a decomposition reaction between organic substances and inorganic substances which are required to be cleaned.

The cleaning liquid 40 of the semiconductor cleaning apparatus according to some embodiments of the present invention may perform cleaning by decomposing a polymer compound using such radicals. This method may reduce oxidation and corrosion of metal patterns as compared with existing cleaning methods using sulfuric acid or hydrofluoric acid. Also, when the lifetime elapses, since the radicals return to harmless liquids or gases such as water and oxygen again, it may not cause environmental pollution.

The gas supply section 120 (e.g., a gas supply line) may be connected to the solvent supply section 110 (e.g., a solvent supply line) so that the solvent and the gas can be mixed with each other. For example, the gas supply section 120 may be connected to an intermediate part of the solvent supply section 110 to form a combined supply compartment, so that the gas and the solvent can be mixed together by the flow of the solvent. For example, the gas supply section 120 may be connected in the middle of the solvent supply section 110, and the gas and the solvent may be mixed before the mixture of the gas and the solvent is provided to the blending section 200.

The blending section 200 may be connected to the supply section 100. The blending section 200 may include a blending chamber 210 and a pressurizing pump 220. The pressurizing pump 220 may be a booster pump configured to increase pressure of fluid in the blending section 200. For example, the pressure of the mixed liquid S in the blending section 200 may be greater than the pressure of the mixed liquid S in the supply section 100.

The blending chamber 210 may store a mixed liquid S in which the solvent supplied by the solvent supply section 110 and the gas supplied by the gas supply section 120 are mixed with each other. The solvent and the gas composing the mixed liquid S may be mixed with each other by the speed at which the solvent and the gas are supplied. For example, flowing pressure of the gas and the solvent may cause a turbulence to the mixture and may be helpful to mix the gas with the liquid before the mixed liquid S is supplied to the blending chamber 210 (e.g., in the solvent supply section 110). In certain examples, the gas may be dissolved in the solvent. In some examples, the mixed liquid S may include gas bubbles formed in the solvent.

The pressurizing pump 220 may increase the internal pressure of the blending chamber 210. When the pressure increases by the pressurizing pump 220, the proportion of the gas dissolved in the mixed liquid S may increase. As a result, the mixed liquid S may become a supersaturated dissolved liquid in which the gas is supersaturated and dissolved. For example, some or all of the gas may be dissolved in the solvent of the mixed liquid S when the pressurizing pump 220 increases the internal pressure of the blending chamber 210.

The bubble formation section 300 may be connected to the blending section 200. The bubble formation section 300 may include a partition wall 310 and an orifice 320. The partition wall 310 may block the mixed liquid S supersaturated at a high pressure in the blending section 200.

The partition wall 310 may block the blending chamber 210 and the bubble formation section 300 in certain steps. For example, the partition wall 310 may be a wall that blocks the space between the blending chamber 210 and the bubble formation section 300.

The orifice 320 may be a hole formed in the partition wall 310. The orifice 320 may have a first diameter and/or width D1. A plurality of orifices 320 may exist in the partition 310. The orifice 320 may be a passage through which the mixed liquid S moves from the blending chamber 210 to the bubble formation section 300. For example, the bubble formation section 300 may be configured to form bubbles in the mixed liquid S by lowering pressure of the mixed liquid S. For example, the pressure of the mixed liquid S in the bubble formation section 300 may be lower than the pressure of the mixed liquid S in the blending section 200.

The orifice 320 is closed until the mixed liquid S is supersaturated, and then the orifice 320 may be opened simultaneously after the mixed liquid S is supersaturated. As a result, the mixed liquid S may move from the blending chamber 210 to the bubble formation section 300 via the orifice 320.

At this time, since the bubble formation section 300 has a second diameter and/or width D2 which is larger than the first diameter/width D1 of the orifice 320, the pressure applied to the mixed liquid S may rapidly drop. For example, since the mixed liquid S has a high pressure by the pressurizing pump 220 in the blending section 200, the pressure in the bubble formation section 300 may be greatly lower than that of the blending section 200. For example, a cross-sectional area of the bubble formation section 300 may be greater than a cross-sectional area of a sum of all of the orifices, and the cross-sectional areas may be perpendicular to the flowing direction of the mixed liquid S.

Accordingly, in the bubble formation section 300, a bubble B may be formed inside the mixed liquid S. The bubble B may be a gas bubble formed of the gas supplied by the gas supply section 120. For example, a gas may exist inside the bubble B. For example, the gas dissolved in the solvent of the mixed liquid S in the blending section 210 may be extracted/separated from the solvent and forms bubbles in the bubble formation section 300. For example, the mixed liquid S in the bubble formation section 300 may be a mixture of the bubbles and the solvent. For example, some gas may be still dissolved in the solvent in the bubble formation section 300.

The plasma generator 350 may be connected to the bubble formation section 300. The mixed liquid S may move from the bubble formation section 300 to the plasma generator 350. The plasma generator 350 may include a plasma electrode 400 and an insulating coating 410.

Figure 3:
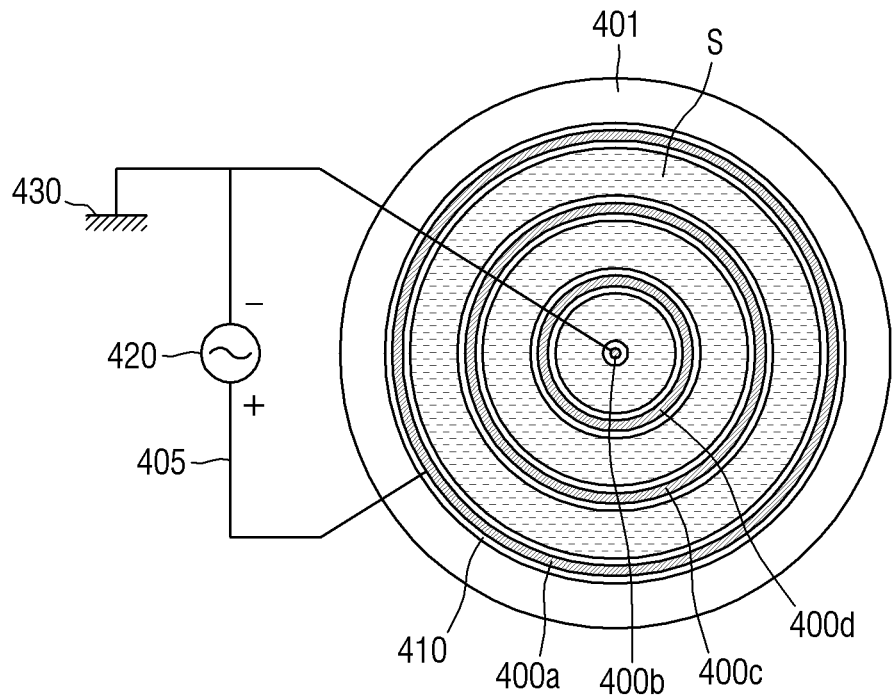
FIG. 3 is a cross-sectional view taken along line A-A' of FIG. 2.
Figure 3:
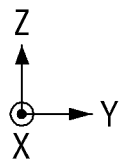
Figure 4:
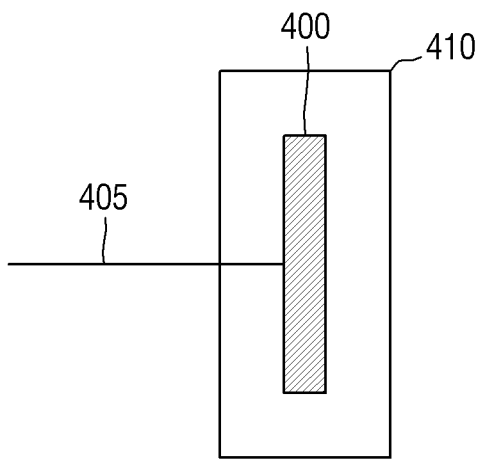
FIG. 4 is a conceptual diagram for explaining a plasma electrode of FIG. 3 in detail.

FIG. 3 is a cross-sectional view taken along the line A-A' of FIG. 2, and FIG. 4 is a conceptual view for explaining the plasma electrode of FIG. 3 in detail.

Referring to FIGS. 2 to 4, the plasma generator 350 may include a plasma electrode outer wall 401, a plasma electrode 400, an insulating coating 410, an RF pulse power supply 420 and an electric wire 405.

The plasma electrode outer wall 401 may guide an advancing/flowing direction of the mixed liquid S. For example, the mixed liquid S may flow through an inner space surrounded by the plasma electrode outer wall 401. The plasma electrode outer wall 401 may have, for example, a cylindrical shape extending in the first direction X. The plasma electrode outer wall 401 may include an insulator.

The plasma electrode 400 may be connected to the RF pulse power supply 420 via the electric wire 405 to apply an RF pulse power to the mixed liquid S. The plasma electrode 400 may include a first electrode 400a, a second electrode 400b, a third electrode 400c, and a fourth electrode 400d. The first electrode 400a may be connected to the RF pulse power supply 420 via the electric wire 405. The second electrode 400b may be connected to a ground terminal 430 via the electric wire 405. For example, the first electrode 400a may have a cylindrical shape and the second electrode 400b may be disposed at the center of the cylinder defined by the first electrode 400a. The first and second electrodes 400a and 400b may extend in the first direction X.

The first electrode 400a and the second electrode 400b may apply a voltage to the mixed liquid S between the first electrode 400a and the second electrode 400b to convert gas in the bubble B of the mixed liquid S into plasma. Therefore, the bubble B of the mixed liquid S may be converted into a plasma bubble BP. The plasma bubble BP may be obtained by a conversion of the gas inside the bubble into plasma, and such plasma may be defined as bubble liquid plasma.

The first electrode 400a and the second electrode 400b may be disposed on the side surface of a passage through which the mixed liquid S and the bubble B move. This allows RF pulse voltage to be applied to the moving mixed liquid S and bubbles B.

The first electrode 400a and the second electrode 400b may function as a kind of capacitor electrode. Therefore, when the bubble liquid plasma, e.g., the plasma bubble BP is generated between the first electrode 400a and the second electrode 400b, an effect of increasing the capacitor electrode as the conductor occurs. For example, a plurality of capacitors is arranged in series. As a result, the other bubbles B of the mixed liquid S may be further converted into plasma bubbles BP. For example, all or some of the gas in the bubbles B of the mixed liquid S in the plasma generator 350 may be turned into plasma. For example, some or all of the bubbles B of the mixed liquid S in the plasma generator 350 may include plasma and gas.

Similarly, a third electrode 400c and a fourth electrode 400d may be located between the first electrode 400a and the second electrode 400b. Unlike the first electrode 400a and the second electrode 400b, the third electrode 400c and the fourth electrode 400d are not directly connected to the RF pulse power supply 420, and are not directly connected to the ground terminal 430. However, if the third electrode 400c and the fourth electrode 400d are added between the first electrode 400a and the second electrode 400b, there is an effect of increasing the capacitor electrodes in the form in which the capacitors are arranged/connected in series. As a result, as the same effects as a plurality of series capacitors, the third electrode 400c, the fourth electrode 400d and the plasma bubbles BP may apply the RF pulse voltage to the mixed liquid S between the first electrode 400a and the second electrode 400b.

The first electrode 400a, the second electrode 400b, the third electrode 400c, and the fourth electrode 400d may be surrounded by respective insulating coatings 410. The insulating coatings 410 may include an insulator. For example, the first electrode 400a, the second electrode 400b, the third electrode 400c and the fourth electrode 400d may not contact the mixed liquid S. The term "contact" as used herein refers to items that touch each other, with no other items therebetween.

FIG. 3 illustrates two electrodes (a third electrode 400c and a fourth electrode 400d) arranged between the first electrode 400a and the second electrode 400b, but the present embodiment is not limited thereto. For example, the number of electrodes disposed between the first electrode 400a and the second electrode 400b may be more than two or may be less than two. In certain embodiments, no electrode may be disposed between the first electrode 400a and the second electrode 400b.

Referring to FIG. 2 again, the mixing section 500 may be connected to the plasma generator 350. The mixing section 500 may allow the mixed liquid S including plasma bubbles BP to be mixed well. Since the mixed liquid S from the supply section 100 has a velocity component in the first direction X, the mixed liquid S may uniformly dissolve the radicals generated from the plasma inside the plasma bubbles BP, while passing through the mixing section 500.

The mixing section 500 may include a mixing section outer wall 501 and a mixer 530. The mixing section outer wall 501 may be a housing which forms the mixing section 500. The mixing section outer wall 501 may enclose a space in which the mixed liquid S moves in the first direction. The mixing section outer wall 501 may extend in the first direction X to guide the advancing/flowing direction of the mixed liquid S.

Uneven shapes 510 and 520 may be formed inside the mixing section outer wall 501. The uneven shapes 510 and 520 may include a protrusion 510 and a recess 520.

The protrusion 510 may be a portion protruding from the mixing section outer wall 501 in an inward direction of the mixing section 500. The recess 520 may be a portion that is lower to (e.g., recessed toward) the outer side than the protrusion 510 on the mixing section outer wall 501. A plurality of protrusions 510 and a plurality of recesses 520 may be formed on an inner surface of the mixing section outer wall 501. The protrusions 510 and the recesses 520 may be alternately arranged in the first direction X.

The protrusion 510 and the recess 520 may be formed in a spiral shape along the inner wall of the mixing section 500. For example, the recess 520 and the protrusion 510 may be formed in a shape like a spiral groove of a nut. The uneven shapes 510 and 520 may increase the mixing efficiency by inducing a spiral flow of the mixed liquid S to have a flowing/advancing direction.

The mixer 530 may play a role obstructing a direct current advancing of the mixed liquid S inside the mixing section 500. For example, the mixer 530 may cause a turbulence to the flow of the mixed liquid S in the mixing section 500. For example, the mixer 530 may cause a traverse flow in the mixed liquid S. The mixed liquid S may move in the first direction X, while forming a first flow f1 via the mixer 530 and the uneven shapes 510 and 520. The first flow f1 may be a rotating flow or a vortex. For example, the mixer 530 may cause a rotational movement in the flow of the mixed liquid S.

The mixing section 500 may induce the radicals generated from the plasma in the plasma bubbles BP located inside the mixed liquid S so as to be uniformly dissolved. In certain examples, before reaching the mixing section 500, some radicals may be dissolved in the mixed liquid S. In the present embodiment, the solubility of the radicals may increase while the mixed liquid S passes through the mixing section 500, and radicals may be uniformly dissolved in the mixed liquid S. For example, the mixed liquid S in the mixing section 500 may include the solvent containing the radicals and/or bubbles B including the gas and/or the plasma.

Referring to FIGS. 1 and 2 again, the first discharge nozzle 600 may be connected to the mixing section 500. The first discharge nozzle 600 may discharge the mixed liquid S containing radicals, e.g., the cleaning liquid 40 onto the wafer W. For example, the mixed liquid S discharged from the first discharge nozzle 600 may include the solvent containing the radicals. In certain embodiments, the mixed liquid S discharged from the first discharge nozzle 600 may include bubbles B including the gas and/or the plasma.

The first discharge nozzle 600 may adopt a center discharge type. For example, the first discharge nozzle 600 may inject the cleaning liquid 40 onto a central portion of the upper surface of the wafer W seated on the chuck 10. The injected cleaning liquid 40 may spread from the central portion of the wafer W to an edge portion of the wafer W.

In another process, the first discharge nozzle 600 may be located at a different position, not above the wafer W, and when it is necessary to inject the cleaning liquid 40, the first discharge nozzle 600 may move to the central portion of the wafer W to inject the cleaning liquid 40.

The first cleaning liquid processing apparatus 20 according to some embodiments of the present invention may be an in-line apparatus. For example, the first cleaning liquid processing apparatus 20 may generate the cleaning liquid 40 containing radicals and may immediately use it in the cleaning process. This may be beneficial because the lifetime of the radicals is very short, it may be hard to separately store and use the cleaning liquid 40, e.g., later.

The first cleaning liquid processing apparatus 20 according to the present embodiment may use the cleaning liquid 40 including radicals, and without components of hydrofluoric acid or sulfuric acid. As a result, it is possible to prevent or reduce corrosion or oxidation of the metal patterns due to the cleaning liquid 40, and the metal patterns formed on the wafer W may be better protected. Accordingly, the performance and reliability of the semiconductor element on the wafer W may be improved.

Since radicals change to harmless materials after a short lifetime, the cleaning liquid 40 using radicals is environmentally friendly. Further, the usage of the cleaning liquid 40 by the first cleaning liquid processing apparatus 20 according to the present embodiment may reduce the use of chemical solution and may also reduce the cost.

Hereinafter, a semiconductor cleaning apparatus according to some embodiments of the present invention will be described with reference to FIGS. 1, 2, and 5. Repeated parts of the above explanation may be omitted or simplified.

Figure 5:
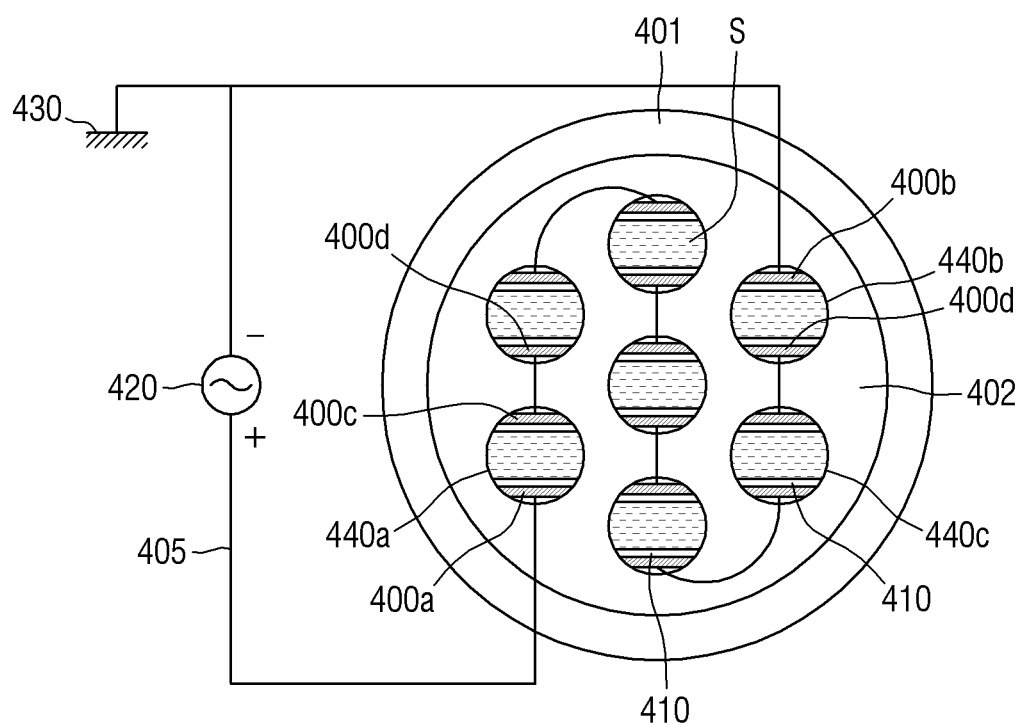
FIG. 5 is a conceptual diagram for explaining a semiconductor cleaning apparatus according to some embodiments of the present invention.

FIG. 5 is a conceptual diagram for explaining the semiconductor cleaning apparatus according to some embodiments of the present invention.

Referring to FIGS. 1, 2, and 5, a plasma generator 350 of the semiconductor cleaning apparatus according to some embodiments of the present invention may be in a form of a shower head.

For example, the plasma generator 350 may include a first penetration hole 440*a*, a second penetration hole 440*b*, a third penetration hole 440*c* and a filling film 402.

The plasma generator 350 may fill an interior defined by the outer wall 401 of the plasma electrode with the filling film 402. The first penetration hole 440*a*, the second penetration hole 440*b*, and the third penetration hole 440*c* may be located inside the filling film 402. The filling film 402 may include an insulator.

The first penetration hole 440*a* may penetrate the filling film 402 in the first direction X. A passage through which the mixed liquid S may flow may be formed in the first penetration hole 440*a*. Two electrodes may be formed on the inner wall of the first penetration hole 440*a*.

For example, a first electrode 400*a* may be formed on a part of the inner wall of the first penetration hole 440*a*. The first electrode 400*a* may be covered with an insulating coating 410. The third electrode 400*c* may be formed to be separated from the first electrode 400*a* on the opposite side of the first electrode 400*a* of the first penetration hole 440*a*. Therefore, the mixed liquid S in the first penetration hole 440*a* may flow between the first electrode 400*a* and the third electrode 400*c*. The first electrode 400*a* may be electrically connected to the RF power supply 420 by an electric wire 405.

The second penetration hole 440*b* may penetrate the filling film 402 in the first direction X. The second penetration hole 440*b* may be spaced apart from the first penetration hole 440*a*. A passage through which the mixed liquid S may flow may be formed inside the second penetration hole 440*b*. Two electrodes may be formed on the inner wall of the second penetration hole 440*b*.

For example, the second electrode 400*b* may be formed on a part of the inner wall of the second penetration hole 440*b*. The second electrode 400*b* may be covered with an insulating coating 410. The fourth electrode 400*d* may be formed to be separated from the second electrode 400*b* on the opposite side of the second electrode 400*b* of the second penetration hole 440*b*. Therefore, the mixed liquid S in the second penetration hole 440*b* may flow between the second electrode 400*b* and the fourth electrode 400*d*. The second electrode 400*b* may be connected to the ground terminal 430 by the electric wire 405.

The third penetration hole 440*c* may penetrate the filling film 402 in the first direction X. The third penetration hole 440*c* may be spaced apart from the first penetration hole 440*a* and the second penetration hole 440*b*. A passage through which the mixed liquid S may flow may be formed inside the third penetration hole 440*c*. Two electrodes may be formed on the inner wall of the third penetration hole 440*c*.

In certain embodiments, a plurality of the third penetration holes 440*c* may be formed in the filling film 402. For example, one first penetration hole 440*a*, one second penetration hole 440*b* and the plurality of third penetration holes 440*c* may be formed in the filling film 402. For example, the number of the third penetration holes 440*c* may be two or more. In certain embodiments, the plasma generator 350 may not have the third penetration hole 440*c* at all.

For example, the third electrode 400c and the fourth electrode 400d may be formed to be separated from each other on a part of the inner wall of the third penetration hole 440c. The mixed liquid S may flow between the third electrode 400c and the fourth electrode 400d. In the plurality of third penetration holes 440c, a third electrode 400c may be electrically connected to a fourth electrode 400d of another third penetration hole 440c, e.g., positioned adjacent. Similarly, a fourth electrode 400d may be electrically connected to a third electrode 400c of another third penetration hole 440c, e.g., positioned adjacent.

For example, capacitors formed by the first to fourth electrodes 440a-440d may be arranged in series in which a plurality of pairs of the third electrode 400c and the fourth electrode 400d are arranged between the first electrode 400a and the second electrode 400b. For example, the number of pairs of the third electrode 400c and the fourth electrode 400d may be one or more. For example, there may be no third penetration hole 440c in the plasma generator 350, and only one pair of the third electrode 400c and the fourth electrode 400d may be formed in the plasma generator 350.

The plasma generator 350 according to the present embodiment may facilitate insulating coatings 410 to completely surround the electrodes. For example, the first to fourth electrodes 400a, 400b, 400c and 400d may be completely surrounded by respective insulating coatings 410 in certain embodiments.

Hereinafter, a semiconductor cleaning apparatus according to some embodiments of the present invention will be described with reference to FIGS. 1, 2 and 6. Repeated parts of the above explanation may be omitted or simplified.

Figure 6:
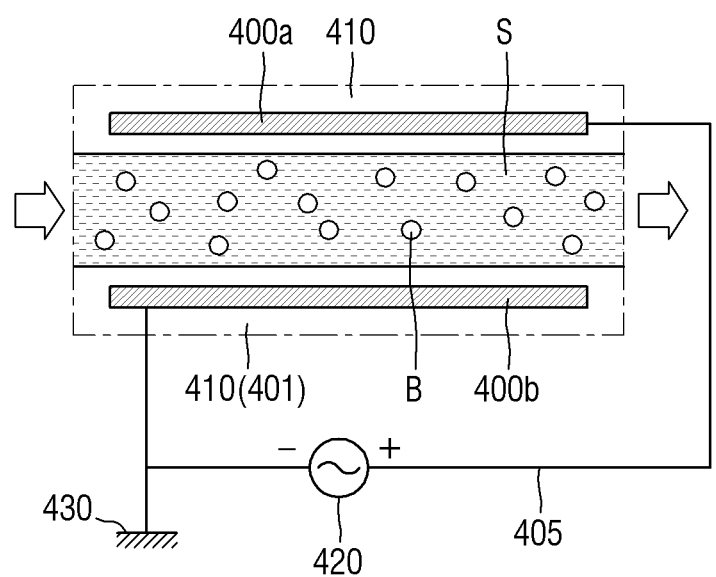
FIG. 6 is a conceptual diagram for explaining a plasma generator of FIG. 2 in detail.

FIG. 6 is a conceptual diagram for explaining the semiconductor cleaning apparatus according to some embodiments of the present invention.

Referring to FIGS. 1, 2 and 6, the first electrode 400a and the second electrode 400b of the plasma generator 350 of the semiconductor cleaning apparatus according to some embodiments of the present invention may extend in the first direction X, while being surrounded by the plasma electrode outer wall 401 or the insulating coatings 410.

FIG. 6 may illustrate not only the arrangement form of the first electrode 400a and the second electrode 400b but also the arrangement form of the first electrode 400a and the third electrode 400c or the second electrode 400b and the fourth electrode 400d, and the like. For the sake of convenience, the third electrode 400c and the fourth electrode 400d are not illustrated, and adjacent electrodes are illustrated as being the first electrode 400a and the second electrode 400b.

The first electrode 400a and the second electrode 400b of FIG. 3 or FIG. 5 may also extend in the first direction X as illustrated in FIG. 6. The first electrode 400a and the second electrode 400b may be spaced apart from each other in the third direction Z.

Each of the first electrode 400a and the second electrode 400b may be integrally formed in the first direction X in which the plasma generator 350 extends. Accordingly, the bubbles B may be efficiently converted into the plasma bubbles BP over a large area.

Hereinafter, a semiconductor cleaning apparatus according to some embodiments of the present invention will be described with reference to FIGS. 1, 2, and 7. Repeated parts of the above explanation may be omitted or simplified.

Figure 7:
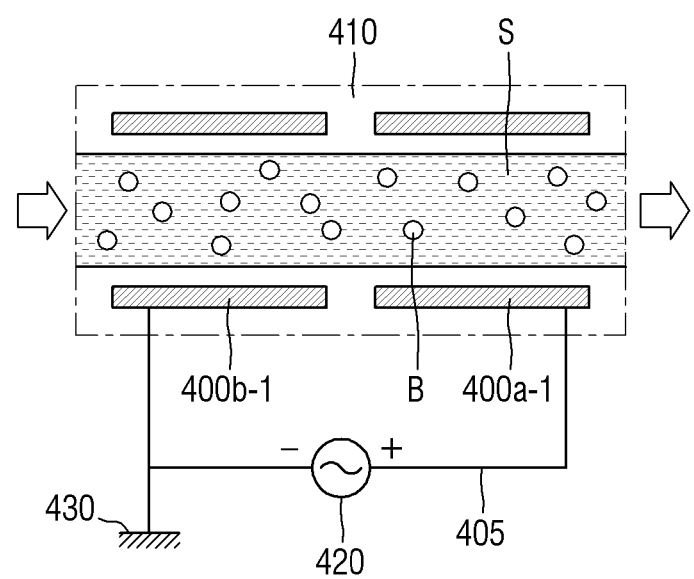
FIG. 7 is a conceptual diagram for explaining a semiconductor cleaning apparatus according to some embodiments of the present invention.

FIG. 7 is a conceptual diagram for explaining the semiconductor cleaning apparatus according to some embodiments of the present invention.

Referring to FIGS. 1, 2 and 7, each of a first electrode 400a-1 and a second electrode 400b-1 of the plasma generator 350 of the semiconductor cleaning apparatus according to some embodiments of the present invention extends in the first direction X in a state of being surrounded by the plasma electrode outer wall 401 and/or an insulating coating 410, and may be formed in a separate form instead of an integrated form, e.g., disclosed in the previous embodiments.

FIG. 5 may illustrate not only the arrangement form of the first electrode 400a-1 and the second electrode 400b-1 but also the arrangement of the adjacent electrodes such as the first electrode 400a-1 and the third electrode or the second electrode 400b-1 and the fourth electrode. For convenience, the third electrode and the fourth electrode are not illustrated, and the adjacent electrodes are illustrated as being the first electrode 400a-1 and the second electrode 400b-1.

The first electrode 400a-1 and the second electrode 400b-1 may be spaced apart from each other in the first direction X. For example, the first electrode 400a-1 and the second electrode 400b-1 may be arranged such that the electrodes extending in the first direction X are separated and divided into two electrodes. For example, the first electrode 400a-1 and the second electrode 400b-1 spaced apart from each other may be arranged in a straight line extending to the first direction X.

In this embodiment, since a voltage is applied along a path in which the bubbles B move, the time at which the voltage is applied to the bubbles becomes relatively longer, and it is possible to efficiently form the bubble liquid plasma.

Hereinafter, a semiconductor cleaning apparatus according to some embodiments of the present invention will be described with reference to FIGS. 1, 2 and 8. Repeated parts of the above explanation may be omitted or simplified.

Figure 8:
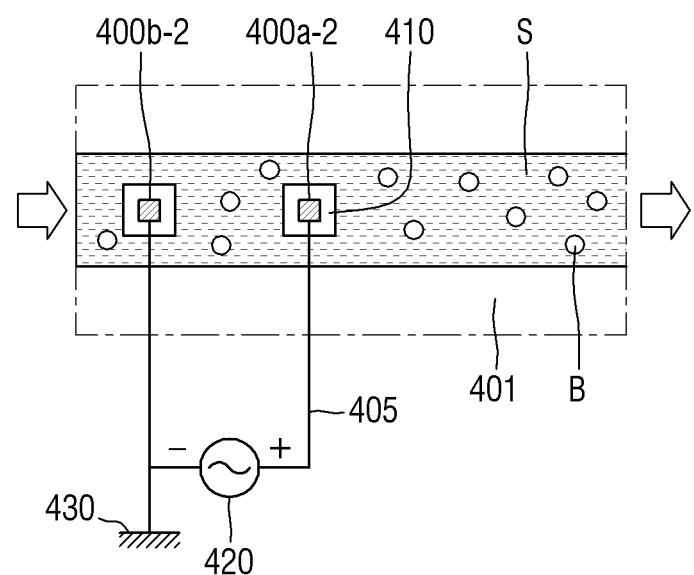
FIG. 8 is a conceptual diagram for explaining a semiconductor cleaning apparatus according to some embodiments of the present invention.

FIG. 8 is a conceptual diagram for explaining the semiconductor cleaning apparatus according to some embodiments of the present invention.

Referring to FIGS. 1, 2 and 8, each of a first electrode 400a-2 and a second electrode 400b-2 of the plasma generator 350 of the semiconductor cleaning apparatus according to some embodiments of the present invention may extend in the second direction Y, and may be surrounded by an insulating coating 410. The first electrode 400a-2 and the second electrode 400b-2 may be located in the advancing/flowing passage of the mixed liquid S and the bubbles B. For example, the first electrode 400a-2 and the second electrode 400b-2 may be disposed in a middle of the flow path of the mixed liquid S in the plasma generator 350.

The first electrode 400a-2 and the second electrode 400b-2 may extend in a second direction Y intersecting the first direction X which is the advancing/flowing direction of the bubbles B. Therefore, the bubbles B may not receive the RF pulse voltage after passing through the second electrode 400b-2. The first electrode 400a-2 and the second electrode 400b-2 according to the present embodiment are spaced apart from each other along the advancing/flowing direction of the bubbles B and may reduce the advancing/flowing speed of the mixed liquid S and the bubbles B. Accordingly, it may be beneficial to sufficiently secure the time for applying the voltage to the bubbles B and to increase the efficiency of plasma formation.

The first electrode 400a-2 and the second electrode 400b-2 may apply the voltage to the bubbles B in a relatively small area. For example, as the regions of the first electrode 400a-2 and the second electrode 400b-2 to which the voltage is applied get smaller (e.g., narrowed), the intensity of the electric field applied per unit area may be relatively increased. Therefore, the efficiency of plasma formation may be increased.

Hereinafter, a semiconductor cleaning apparatus according to some embodiments of the present invention will be described with reference to FIGS. 1, 2, 9, and 10. Repeated parts of the above explanation may be omitted or simplified.

Figure 9:
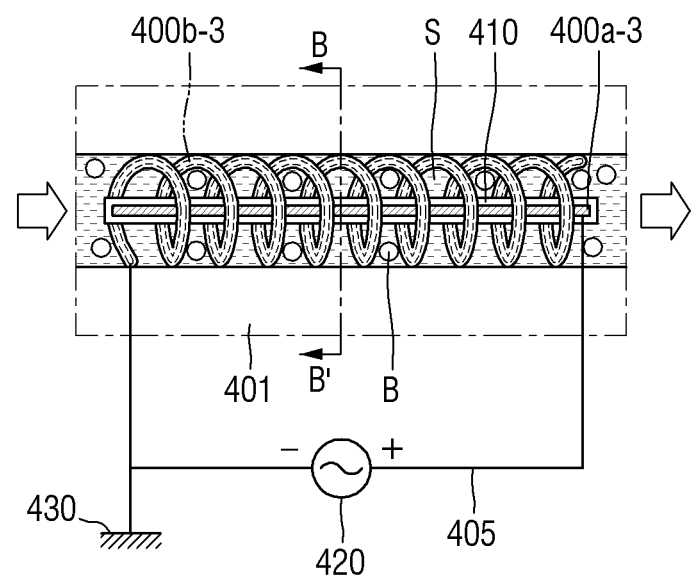
FIG. 9 is a conceptual diagram for explaining a semiconductor cleaning apparatus according to some embodiments of the present invention.
Figure 10:
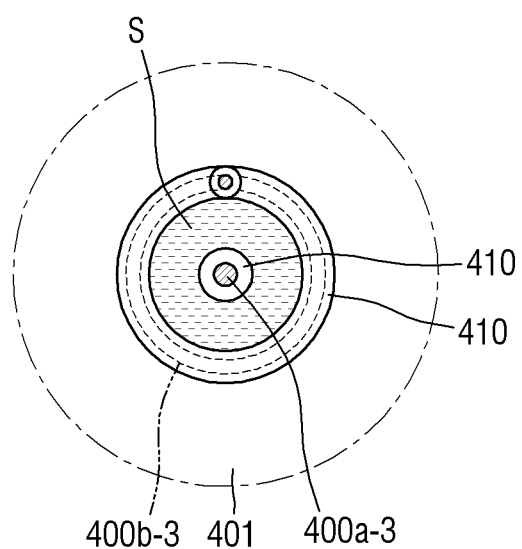
FIG. 10 is a cross-sectional view taken along the line B-B' of FIG. 9.

FIG. 9 is a conceptual diagram for explaining the semiconductor cleaning apparatus according to some embodiments of the present invention, and FIG. 10 is a cross-sectional view taken along B-B' of FIG. 9.

Referring to FIGS. 1, 2, 9, and 10, a first electrode 400a-3 of the plasma generator 350 of the semiconductor cleaning apparatus according to some embodiments of the present invention is in the form of a core, and the second electrode 400b-3 may be in the form of a coil which wraps the first electrode 400a-3 which is the core.

The first electrode 400a-3 extends in the first direction X and may be located at the center of the interior of the plasma generator 350. The second electrode 400b-3 is spirally wound around the first electrode 400a-3 and may rotate around and extend in the first direction X. At this time, the second electrode 400b-3 may have a shape of a spiral, while contacting the inside of the plasma electrode outer wall 401. Accordingly, the mixed liquid S and the bubbles B may travel in the first direction X inside the second electrode 400b-3, e.g., between the first and second electrodes 400a-3 and 400b-3.

The first electrode 400a-3 and the second electrode 400b-3 according to this embodiment may consecutively apply the voltage, while the mixed liquid S and the bubbles B travel through the plasma generator 350 in the first direction X, and the variation of the voltage may not great depending on the position. For example, the voltage applied to the mixed liquid S and the bubbles B may be uniform throughout the plasma generator 350.

Hereinafter, a semiconductor cleaning apparatus according to some embodiments of the present invention will be described with reference to FIG. 11. Repeated parts of the above explanation may be omitted or simplified.

Figure 11:
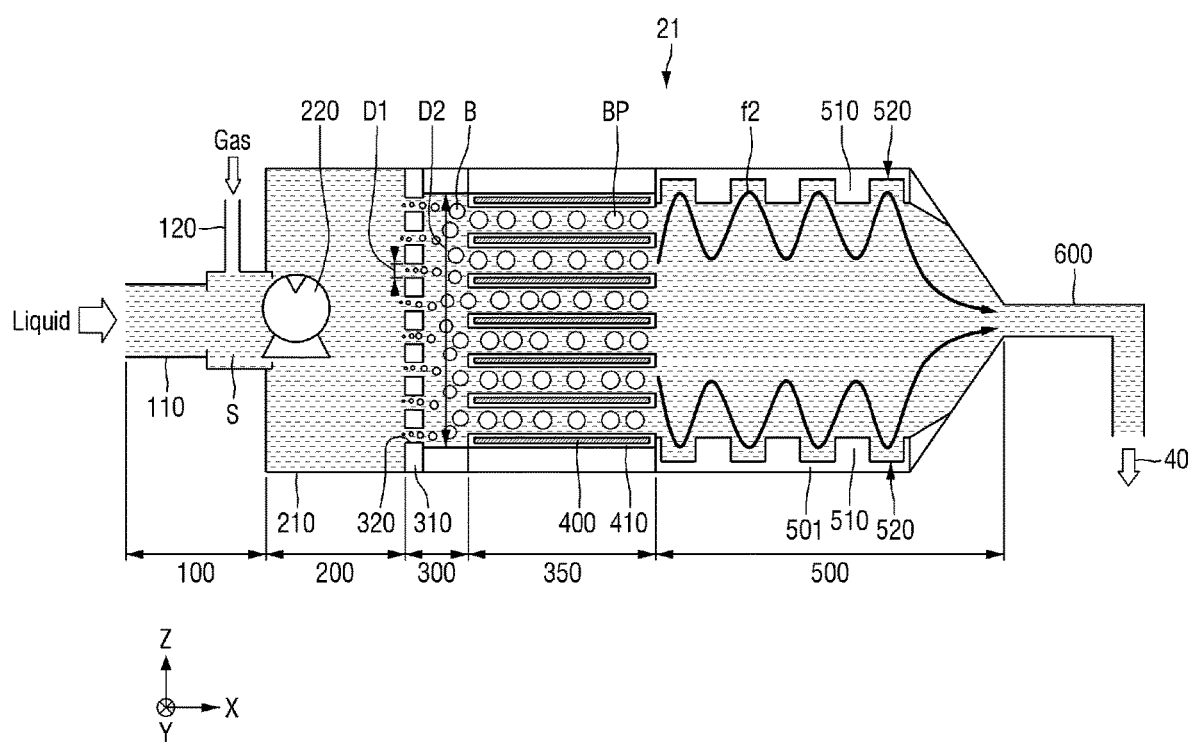
FIG. 11 is a conceptual diagram for explaining a semiconductor cleaning apparatus according to some embodiments of the present invention.

FIG. 11 is a conceptual diagram for explaining the semiconductor cleaning apparatus according to some embodiments of the present invention.

Referring to FIG. 11, in a mixing section 500 of a second cleaning liquid processing apparatus 21 of the semiconductor cleaning apparatus according to some embodiments of the present invention, uneven shapes 510 and 520 may be uniformly arranged.

For example, the protrusions 510 and the recesses 520 among the uneven shapes 510 and 520 may be arranged along the first direction X, irrespective of the positions in the second direction Y and the third direction Z.

According to this embodiment, the symmetrical structure of the uneven shapes 510 and 520 may be helpful for causing a vortex effect in a portion close to the mixing section outer wall 501 of the mixing section 500. As a result, a second flow f2 is formed in the portion adjacent to the mixing section outer wall 501, and the radicals generated from the plasma may be dissolved uniformly in the mixed liquid S. For example, the second flow f2 may be a traversing flow with respect to a main flow of the mixed liquid S.

Hereinafter, a semiconductor cleaning apparatus according to some embodiments of the present invention will be described with reference to FIG. 12. Repeated parts of the above explanation may be omitted or simplified.

Figure 12:
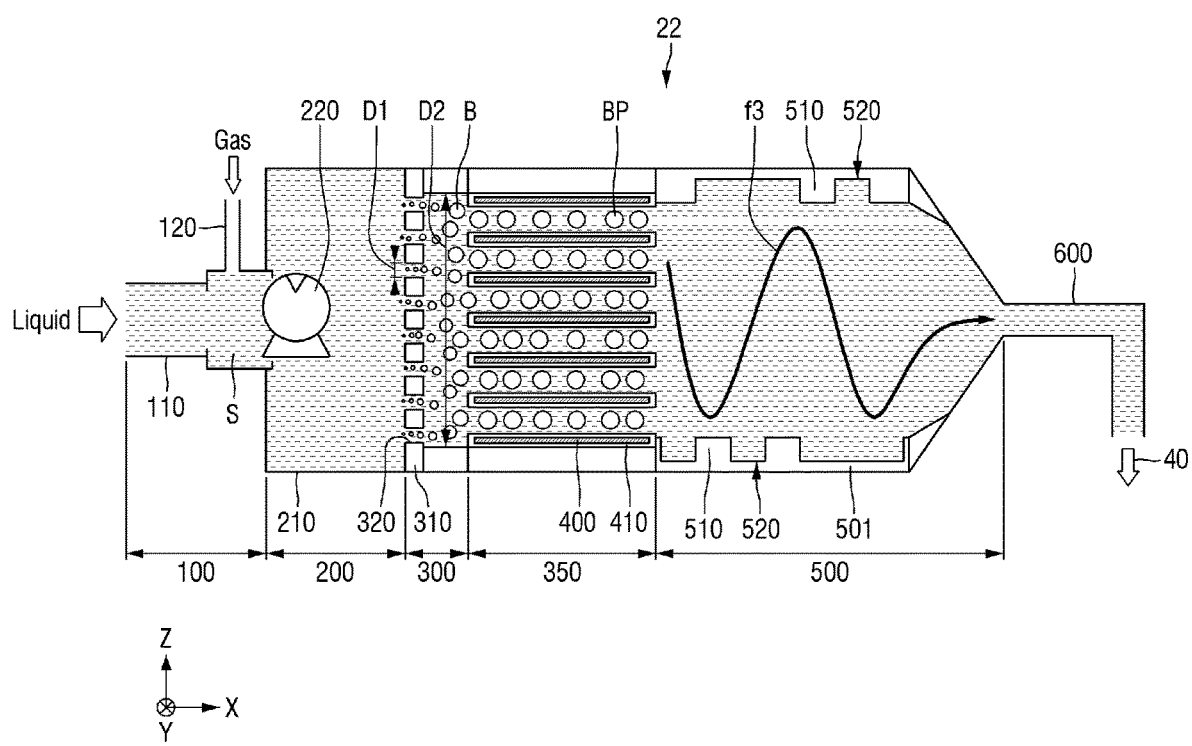
FIG. 12 is a conceptual diagram for explaining a semiconductor cleaning apparatus according to some embodiments of the present invention.

FIG. 12 is a conceptual diagram for explaining the semiconductor cleaning apparatus according to some embodiments of the present invention.

Referring to FIG. 12, in a mixing section 500 of a third cleaning liquid processing apparatus 22 of the semiconductor cleaning apparatus according to some embodiments of the present invention, uneven shapes 510 and 520 may be asymmetrically arranged.

For example, the protrusions 510 and the recesses 520 among the uneven shapes 510 and 520 may be arranged asymmetrically on opposite surfaces of the mixing section outer walls 501 facing each other, e.g., in a cross-sectional view.

According to this embodiment, a large flow of the mixed liquid S may be formed at the central portion of the mixing section 500 due to the asymmetric structure of the uneven shapes 510 and 520. This may mix the mixed liquid S efficiently. A third flow f3 may be formed at the central portion of the mixing section 500, and the radicals generated from the plasma may be dissolved uniformly in the mixed liquid S.

Hereinafter, a semiconductor cleaning apparatus according to some embodiments of the present invention will be described with reference to FIG. 13. Repeated parts of the above explanation may be omitted or simplified.

Figure 13:
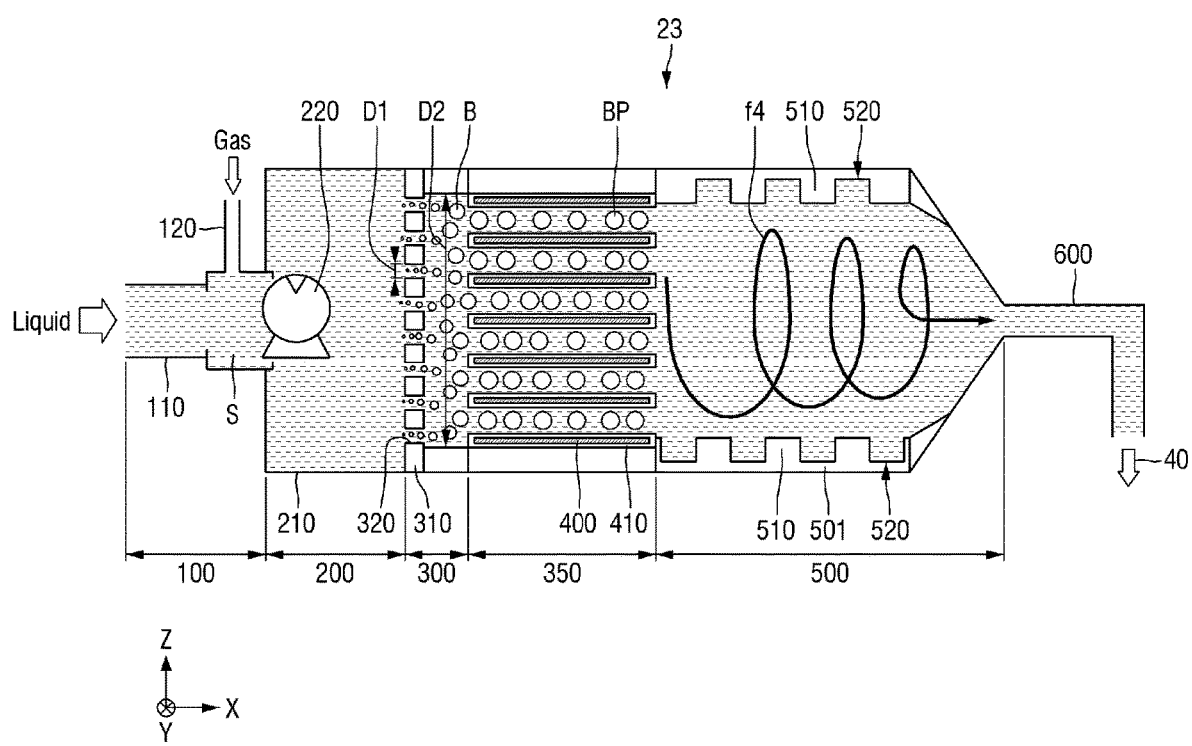
FIG. 13 is a conceptual diagram for explaining a semiconductor cleaning apparatus according to some embodiments of the present invention.

FIG. 13 is a conceptual diagram for explaining the semiconductor cleaning apparatus according to some embodiments of the present invention.

Referring to FIG. 13, in a mixing section 500 of a fourth cleaning liquid processing apparatus 23 of the semiconductor cleaning apparatus according to some embodiments of the present invention, uneven shapes 510 and 520 may be arranged in a spiral shape.

For example, the protrusions 510 and the recesses 520 may be alternately arranged in a spiral shape in the first direction X. Accordingly, the uneven shapes 510 and 520 may increase the mixing efficiency by inducing the spiral flow of the mixed liquid S to have the flowing/advancing direction of the fourth flow f4.

Since the mixing section 500 of the fourth cleaning processing apparatus 23 of the present embodiment does not add the mixer 530 of FIG. 2, the flow of the mixed liquid S in the first direction X may be less obstructed, and the mixing efficiency may be optimized.

Hereinafter, a semiconductor cleaning apparatus according to some embodiments of the present invention will be described referring to FIG. 14. Repeated parts of the above explanation may be omitted or simplified.

Figure 14:
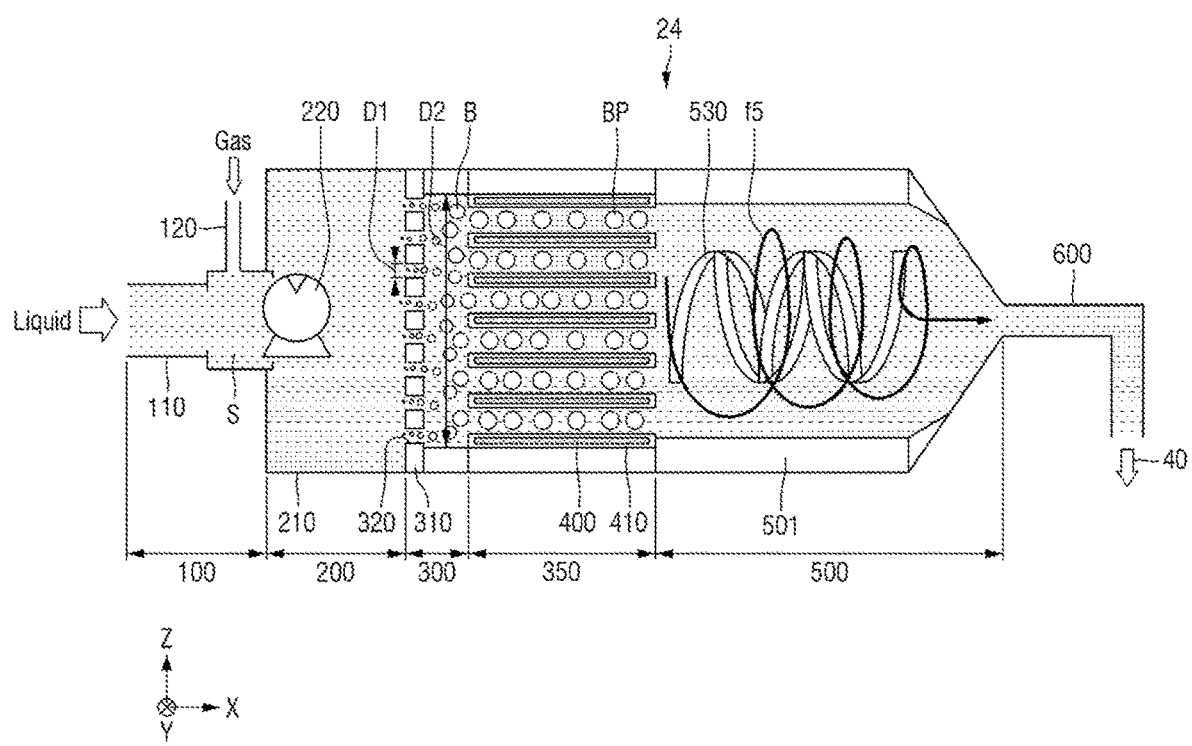
FIG. 14 is a conceptual diagram for explaining a semiconductor cleaning apparatus according to some embodiments of the present invention.

FIG. 14 is a conceptual diagram for explaining the semiconductor cleaning apparatus according to some embodiments of the present invention.

Referring to FIG. 14, a mixing section 500 of a fifth cleaning liquid processing apparatus 24 of the semiconductor cleaning apparatus according to some embodiments of the present invention may include a mixer 530.

The mixer 530 may play a role obstructing a direct current advancing of the mixed liquid S inside the mixing section 500. For example, the mixer 530 may cause a turbulence to the flow of the mixed liquid S in the mixing section 500. The mixed liquid S may move in the first direction X, while forming a fifth flow f5 via the mixer 530. The fifth flow f5 may be a rotating flow or a vortex.

The mixing section 500 of the fifth cleaning liquid processing apparatus 24 of this embodiment may not include the uneven shapes 510 and 520 of FIG. 2. Since the uneven shapes 510 and 520 do not exist, the fifth flow f5 may be less disturbed near the mixing section outer wall 501, and the mixing efficiency may be optimized.

Hereinafter, a semiconductor cleaning apparatus according to some embodiments of the present invention will be described with reference to FIGS. 15 to 17. Repeated parts of the above explanation may be omitted or simplified.

Figure 15:
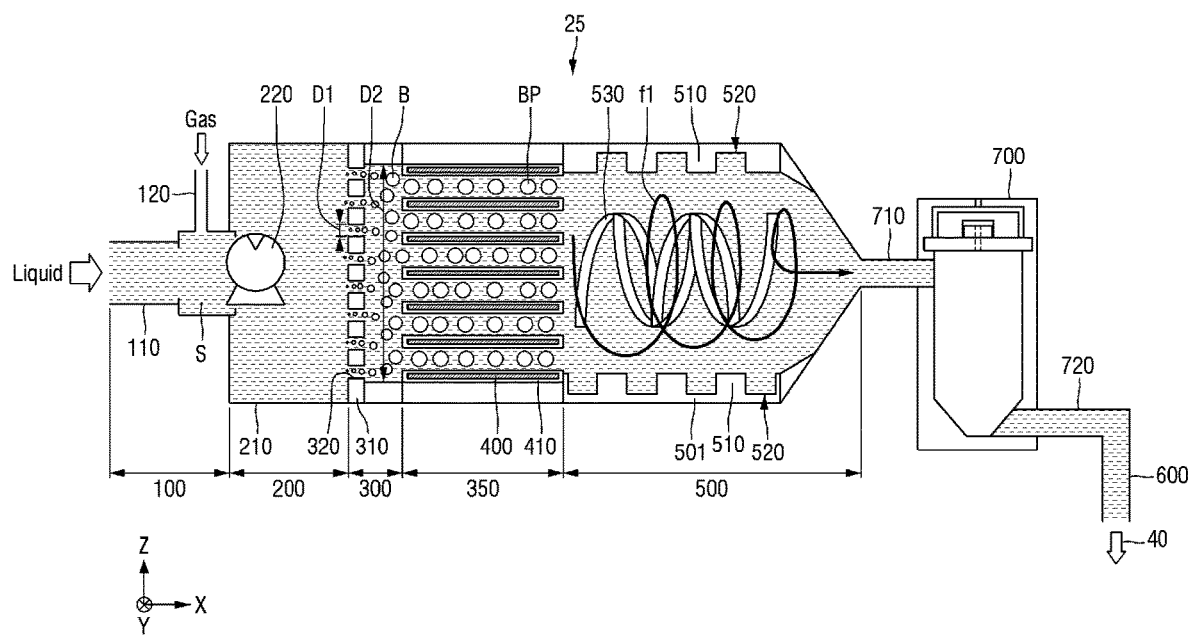
FIG. 15 is a conceptual diagram for explaining a semiconductor cleaning apparatus according to some embodiments of the present invention.
Figure 16:
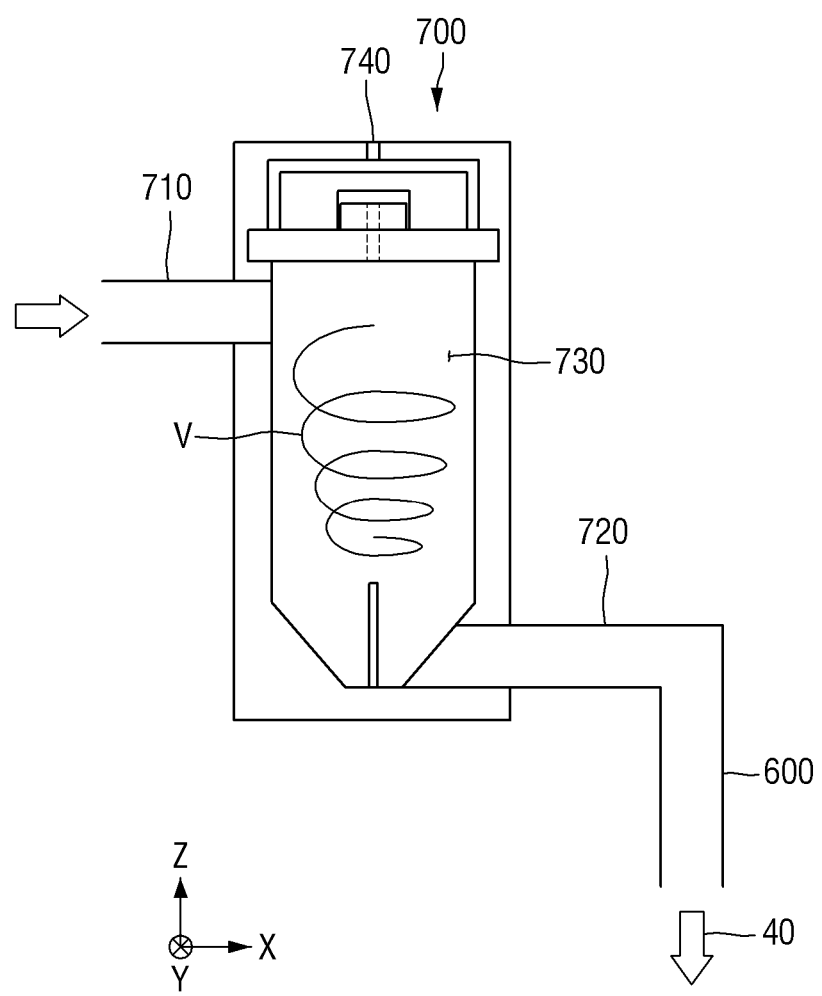
FIG. 16 is a cross-sectional view illustrating a bubble cutter of FIG. 15 in detail.

FIG. 15 is a conceptual view for explaining the semiconductor cleaning apparatus according to some embodiments of the present invention, and FIG. 16 is a cross-sectional view illustrating the bubble cutter of FIG. 15 in detail. FIG. 17 is a cross-sectional view illustrating the bubble cutter of FIG. 15 in detail.

Figure 17:
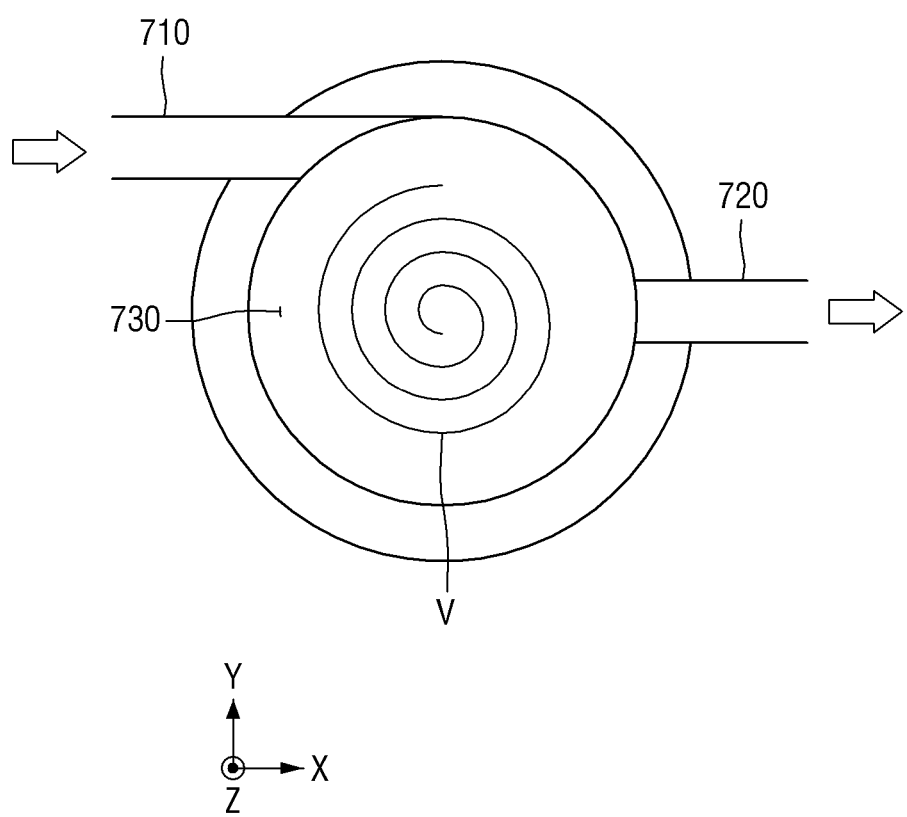
FIG. 17 is a cross-sectional view illustrating the bubble cutter of FIG. 15 in detail.

Referring to FIGS. 15 to 17, a sixth cleaning liquid processing apparatus 25 of the semiconductor cleaning apparatus according to some embodiments of the present invention may further include a bubble cutter 700.

The bubble cutter 700 may be connected to the mixing section 500. The bubble cutter 700 may remove the bubbles B disposed inside the mixed liquid S. The bubble cutter 700 may include an inlet 710, an outlet 720, a tank 730 and a bubble discharge port 740.

The inlet 710 may be an inlet through which the mixed liquid S is supplied into the bubble cutter 700. The inlet 710 may be formed on the upper portion of the bubble cutter 700 as compared with the outlet 720. The inlet 710 may extend in the first direction X so that the speed at which the mixed liquid S travels can be kept as it is. The inlet 710 may be connected to the tank 730. For example, the extending inlet 710 may be helpful to control a flow speed of the mixed liquid S flowing into the bubble cutter 700.

The tank 730 may be connected with the inlet 710 to accommodate the mixed liquid S. For example, the mixed liquid S may be supplied in the tank 730. The mixed liquid S may rotate by the flowing force into the tank 730, e.g., by the moment of inertia of the flowing speed of the mixed liquid S. The bubbles B of the mixed liquid S rotating inside the tank 730 may rise upward, while generating a vortex V. For example, the bubbles B may move upward by a buoyancy.

The bubble discharge port 740 may be a portion which is located at the top of the tank 730 and from which the bubbles B rising upward by the vortex V and/or by the buoyancy is discharged. The bubble discharge port 740 may serve to separate the bubbles B from the mixed liquid S. For example, the bubbles B may be separated from the mixed liquid S by a specific gravity difference from the mixed liquid S, while rotating.

The outlet 720 may be located at the bottom of the tank 730 compared to the inlet 710. The outlet 720 may be a passage through which a cleaning liquid 40 is discharged, and the cleaning liquid may be formed by separating the bubbles B from the mixed liquid S. The outlet 720 may be directly connected to the first discharge nozzle 600 to discharge the cleaning liquid 40 onto the wafer W.

The sixth cleaning liquid processing apparatus 25 according to this embodiment may remove the bubbles B from the cleaning liquid 40, using the bubble cutter 700. As a result, the bubbles B may not be discharged onto the wafer W. In a case where the bubbles B are directly discharged onto the wafer W, since the dispersion of the cleaning liquid on the wafer W is not uniform, cleaning of the wafer W may not be suitably performed. For example, the bubbles B included in the cleaning liquid 40 may cause a non-uniform dispersion of the cleaning liquid 40 on the wafer W.

Hereinafter, a semiconductor cleaning apparatus according to some embodiments of the present invention will be described with reference to FIG. 18. Repeated parts of the above explanation may be omitted or simplified.

Figure 18:
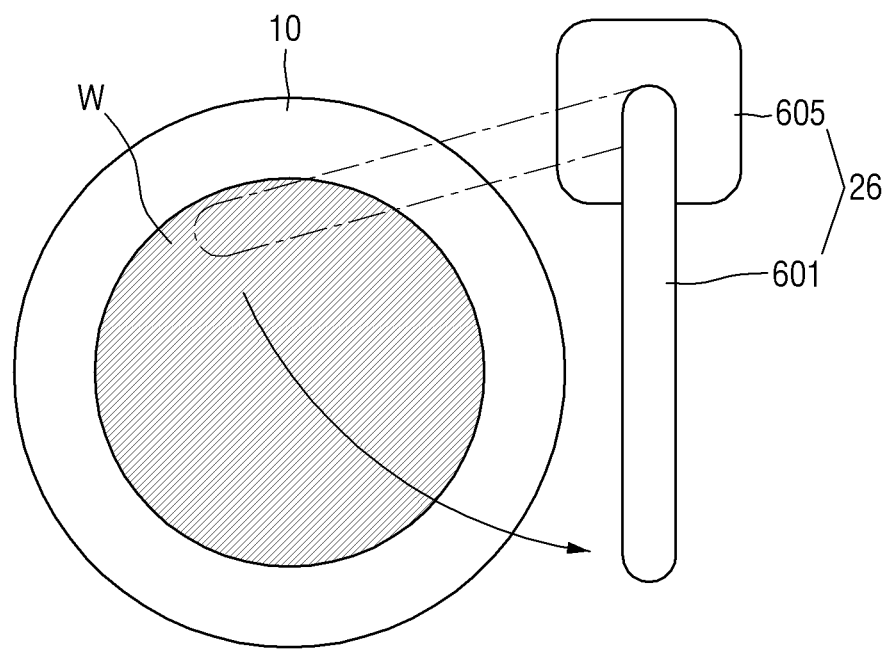
FIG. 18 is a plan conceptual view for explaining a semiconductor cleaning apparatus according to some embodiments of the present invention.

FIG. 18 is a plan conceptual diagram illustrating the semiconductor cleaning apparatus according to some embodiments of the present invention.

Referring to FIG. 18, the semiconductor cleaning apparatus according to some embodiments of the present invention includes a seventh cleaning liquid processing apparatus 26. The seventh cleaning processing apparatus 26 may include a second discharge nozzle 601 and a nozzle fixing part 605.

The second discharge nozzle 601 may move with a locus which draws an arc on the wafer W, e.g., in a plan view, seated on the chuck 10. The second discharge nozzle 601 may uniformly inject the cleaning liquid 40 onto the upper surface of the wafer W, while repeatedly moving along the locus which draws the arc.

The wafer W may uniformly accommodate the cleaning liquid 40 injected by the second discharge nozzle 601, while rotating by the chuck 10.

The nozzle fixing part 605 may fix/hold the second discharge nozzle 601. The nozzle fixing part 605 may serve as an axis of the locus of the arc shape formed while the second discharge nozzle 601 moves. For example, the second discharge nozzle 601 may rotate about the nozzle fixing part 605 while the second discharge nozzle 601 moves along the locus forming the arc. For example, the rotation axis of the rotating second discharge nozzle 601 may correspond to a portion of the nozzle fixing part 605.

In the semiconductor cleaning apparatus according to this embodiment, since the second discharge nozzle 601 injects the cleaning liquid 40 while moving, the cleaning liquid 40 may be more uniformly disposed on the upper surface of the wafer W, and the efficiency of the cleaning process may be improved.

Hereinafter, a semiconductor cleaning apparatus according to some embodiments of the present invention will be described with reference to FIG. 19. Repeated parts of the above explanation may be omitted or simplified.

Figure 19:
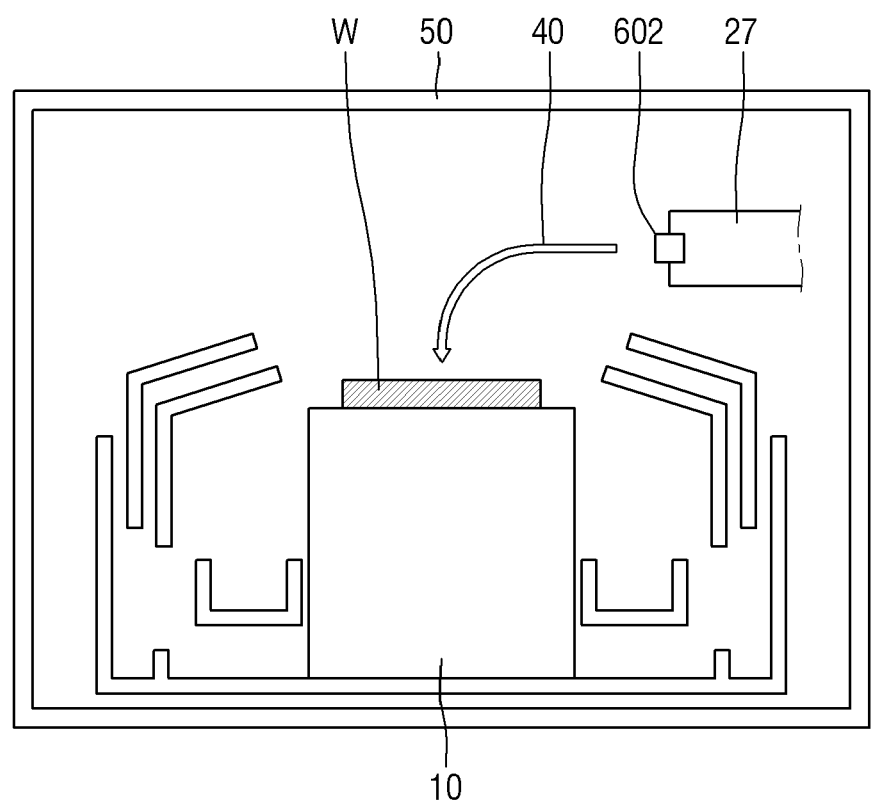
FIG. 19 is a conceptual diagram for explaining a semiconductor cleaning apparatus according to some embodiments of the present invention.

FIG. 19 is a conceptual diagram for explaining the semiconductor cleaning apparatus according to some embodiments of the present invention.

Referring to FIG. 19, the semiconductor cleaning apparatus according to some embodiments of the present invention includes an eighth cleaning liquid processing apparatus 27. The eighth cleaning processing device 27 may include a third discharge nozzle 602.

The third discharge nozzle 602 may be located on the outside of the wafer W, e.g., in a plan view. For example, the end portion of the third discharge nozzle 602 may not vertically overlap the upper surface of the wafer W. For example, the third discharge nozzle 602 may not overlap with the wafer W in a plan view. The third discharge nozzle 602 may horizontally inject the cleaning liquid 40 at a position higher than the upper surface of the wafer W so that the cleaning liquid 40 reaches the upper surface of the wafer W.

The third discharge nozzle 602 may inject the cleaning liquid 40 at a fixed position without moving, and since the wafer W rotates by the chuck 10, the cleaning liquid 40 which reaches the top surface of the wafer W may uniformly spread on the top surface of wafer W.

In this embodiment, since a separate electric power or apparatus for moving the third discharge nozzle 602 is not applied, the cleaning process may be performed at a low cost. It should be noted that the terms such as first, second . . . eighth, as used in certain passages herein are merely used as a naming convention to designate different examples or components. Terms such as "first," "second," etc., used herein are thus used only as a naming convention, unless the context indicates otherwise.

According to an embodiment of the present disclosure, a method of manufacturing a semiconductor device may include a step of placing a wafer on a chuck, and cleaning the wafer using a cleaning liquid and/or a cleaning apparatus described above. The cleaning step may be applied before and/or after a formation of a conductive pattern or an insulating layer/pattern on the wafer. After the formation of one or more conductive patterns and/or insulating patterns/layers, the wafer may be divided into chips, and the chips may be packaged to form electronic devices.

While the present inventive concept has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A cleaning liquid processing apparatus comprising:
   a blending section configured to increase a pressure of a mixed liquid obtained by mixing a liquid and a gas to dissolve the gas into the liquid;
   a bubble formation section configured to lower the pressure of the mixed liquid to form bubbles in the mixed liquid, the bubble formation section including a wall having an orifice, wherein when the orifice is closed, the pressure of the mixed liquid in the blending section increases, and when the orifice is open, the mixed liquid flows from the blending section through the wall via the orifice;
   a plasma generator connected to the bubble formation section and configured to apply a voltage to the mixed liquid to form plasma in the bubbles formed in the mixed liquid, the plasma generator configured such that the plasma is formed in the bubbles while the mixed liquid flows between a first electrode and a second electrode included in the plasma generator, the voltage applied between the first electrode and the second electrode;
   a mixing section connected to the plasma generator and configured to dissolve radicals included in the plasma into the mixed liquid; and
   a discharge nozzle connected to the mixing section and configured to discharge the mixed liquid to a wafer.

2. The cleaning liquid processing apparatus of claim 1, wherein the first electrode and the second electrode have an area disposed therebetween, and a third electrode is disposed between the first electrode and the second electrode and overlaps at least a portion of the area defined between the first electrode and the second electrode.

3. The cleaning liquid processing apparatus of claim 1, further comprising:
   a pump configured to increase the pressure of the mixed liquid disposed inside the blending section to supersaturate and dissolve the gas into the liquid.

4. The cleaning liquid processing apparatus of claim 1, wherein the first electrode is connected to an RF pulse power supply, and
   wherein the second electrode is grounded.

5. The cleaning liquid processing apparatus of claim 1, wherein the mixed liquid in the plasma generator moves in a first direction, and
   the first and second electrodes extend in the first direction.

6. The cleaning liquid processing apparatus of claim 5, wherein the first electrode has a cylindrical shape having a first diameter in a cross-sectional view, and
   wherein the second electrode is located at the center of a cylinder defined by the first electrode.

7. The cleaning liquid processing apparatus of claim 1, wherein the mixing section includes an uneven shape on an inner wall.

8. The cleaning liquid processing apparatus of claim 7, wherein the uneven shape is a spiral.

9. The cleaning liquid processing apparatus of claim 7, wherein the mixing section includes a mixer configured to guide a rotational movement of the mixed liquid therein, and
   wherein the mixer is disposed in a central area of the mixing section spaced apart from side walls of the mixing section.

10. The cleaning liquid processing apparatus of claim 1, further comprising:
    a bubble cutter connected to the mixing section, the bubble cutter configured to remove bubbles disposed inside the mixed liquid.

11. The cleaning liquid processing apparatus of claim 1, wherein the apparatus is configured to sequentially pass the mixed liquid through the bubble formation section, the plasma generator, the mixing section, and the discharge nozzle, and
    wherein the apparatus is configured to directly inject the mixed liquid onto the wafer.

12. The cleaning liquid processing apparatus of claim 1, wherein the plasma generator includes a plasma electrode outer wall extending in a first direction and a filling film defined by the plasma electrode outer wall and including first and second penetration holes formed in the first direction and spaced apart from each other,
    the first electrode is formed on a part of an inner wall of the first penetration hole,
    the second electrode is formed on a part of an inner wall of the second penetration hole.

13. A semiconductor cleaning apparatus comprising:
    a chamber;
    a chuck disposed inside the chamber, the chuck configured to receive a wafer;
    a cleaning liquid processing apparatus configured to inject a cleaning liquid onto an upper surface of the wafer,
    wherein the cleaning liquid processing apparatus includes:
    a blending section configured to increase a pressure of a mixed liquid obtained by mixing a liquid and a gas to dissolve the gas into the liquid;
    a bubble formation section configured to lower the pressure of a mixed liquid to form bubbles in the mixed liquid, the bubble formation section including a wall having a plurality of orifices, wherein when the orifices are closed, the pressure of the mixed liquid in the blending section increases, and when the orifices are open, the mixed liquid flows from the blending section through the wall via the orifices;
    a plasma generator connected to the bubble formation section and configured to apply a voltage to the mixed liquid to form plasma in the bubbles formed in the bubble formation section;
    a mixing section connected to the plasma generator and configured to dissolve radicals included in the plasma into the mixed liquid to form the cleaning liquid, the mixing section including a mixer disposed in a central area spaced apart from side walls of the mixing section; and
    a discharge nozzle connected to the mixing section and configured to discharge the cleaning liquid to the wafer.

14. The semiconductor cleaning apparatus of claim 13, wherein the cleaning liquid processing apparatus is movable in a horizontal direction over an upper surface of the wafer.

15. The semiconductor cleaning apparatus of claim 13, wherein the chuck is configured to rotate the wafer, and
the cleaning liquid processing apparatus is disposed over the chuck.

16. The semiconductor cleaning apparatus of claim 13, wherein the discharge nozzle is movable over the wafer.

17. The semiconductor cleaning apparatus of claim 13, wherein the plasma generator includes a plasma electrode outer wall and a filling film defined by the plasma electrode outer wall and including first and second penetration holes formed in a horizontal direction and spaced apart from each other,
a first electrode is formed on a part of an inner wall of the first penetration hole,
a second electrode is formed on a part of an inner wall of the second penetration hole.

* * * * *